US009201595B2

(12) United States Patent
Lee et al.

(10) Patent No.: US 9,201,595 B2
(45) Date of Patent: Dec. 1, 2015

(54) HIGH SPEED READ ACCESS MEMORY ARRAY WITH VARIATION TOLERANT BYPASS SCHEME WITH PROTECTION CIRCUIT

(71) Applicant: Oracle International Corporation, Redwood City, CA (US)

(72) Inventors: Jungyong Lee, San Jose, CA (US); Singrong Li, San Jose, CA (US); Hoyeol Cho, Palo Alto, CA (US)

(73) Assignee: Oracle International Corporation, Redwood City, CA (US)

( * ) Notice: Subject to any disclaimer, the term of this patent is extended or adjusted under 35 U.S.C. 154(b) by 471 days.

(21) Appl. No.: 13/622,896

(22) Filed: Sep. 19, 2012

(65) Prior Publication Data

US 2014/0082278 A1    Mar. 20, 2014

(51) Int. Cl.
*G06F 12/00* (2006.01)
*G06F 3/06* (2006.01)

(52) U.S. Cl.
CPC ...................... *G06F 3/06* (2013.01)

(58) Field of Classification Search
CPC .......................................................... G06F 3/06
USPC ......................................................... 711/114
See application file for complete search history.

(56) References Cited

U.S. PATENT DOCUMENTS

| 5,581,720 | A  | * | 12/1996 | Kaba ............................. 712/226 |
| 7,417,907 | B1 | * | 8/2008  | Liu .......................... G11C 7/22 |
|           |    |   |         | 365/189.04 |
| 2002/0184580 | A1 | * | 12/2002 | Archibald et al. ............ 714/719 |
| 2005/0270866 | A1 | * | 12/2005 | Ouellette et al. ............. 365/200 |

* cited by examiner

*Primary Examiner* — Larry MacKall
(74) *Attorney, Agent, or Firm* — Marsh Fischmann & Breyfogle LLP (57) ABSTRACT

A memory array for process variation tolerant bypass operation. The memory array may utilize normal read operation data path of a memory I/O module. Accordingly, the speed at which the bypass operation may be executed may be increased. Furthermore, a potential for false read operations introduced by the utilization of the normal read operation data path of the memory I/O module may be reduced using a protect mechanism operable to block the output of false reads from the memory array.

17 Claims, 7 Drawing Sheets

HIGH SPEED READ ACCESS MEMORY ARRAY WITH VARIATION TOLERANT BYPASS SCHEME WITH PROTECTION CIRCUIT

BACKGROUND

In computing systems memory is employed to store data for use in, or resulting from, computing functionality of the computing system. Accordingly, the speed and accuracy with which data may be written to and read from memory may be a limiting factor of the speed at which the computing system may be executed. In this regard, it may be appreciated that the ability to accurately and rapidly write data to and read data from memory may improve the execution time and computing efficiency of a computing system.

Memory commands (e.g., read commands and/or write commands) may be addressed to specific locations in memory. The commands may result in the memory location being written with data associated with a write command or may result in the data in the memory location being read from the memory and provided to another component in the computing system (e.g., a data bus, a processor, another appropriate component, or the like). In this regard, memory may include an input/output (I/O) module or circuitry to control the write and/or read processes executed with respect to the memory. The I/O module for a memory may receive memory commands regarding whether a memory location is to be read from or written to and may control the flow of data to or from the memory. For instance, in the case where the memory location is to be written to, the memory command may include data (e.g., address data, a memory value, etc.) used by the I/O module in writing the data to a memory location.

Additionally, one or more memory commands may be communicated to the memory resulting in a bypass operation. During a bypass operation, both a write command and a read command are issued to a single location in memory. As such, the data associated with the bypass operation is written to the location in memory and read out from the location in memory during a single clock cycle period of the computing system. Prior approaches to bypass operation processing may suffer from significant drawbacks that may affect the efficiency and/or accuracy of the memory when undergoing a bypass operation. As such, the need continues for improved methods and apparatuses to facilitate bypass operations carried out with respect to memory in computing systems.

SUMMARY

The present disclosure describes embodiments of memory arrays that provide for improved bypass operation. Specifically, the embodiments described herein generally utilize normal read/write paths (i.e., normal data paths utilized for standard read/write operations of a memory I/O module) to facilitate bypass operations. However, it is currently recognized that while the use of normal read/write paths of a memory I/O module for bypass operations may increase the speed at which the memory array may be executed, such an approach may also introduce the potential for false data being output in connection with the bypass operation (e.g., due to process variation). Accordingly, the embodiments described herein may provide for protection against corruption of the bypass data read from the memory array location during a bypass operation.

In this regard, a first aspect described herein includes a method for process variation tolerant bypass operation of a memory array. The method includes receiving a memory command at the memory array corresponding to bypass operation of the memory array. The memory command includes bypass data to be written to and read from a memory location of the memory array. The method also includes writing, using a memory I/O module, the bypass data to a location in the memory array and reading, using the memory I/O module, output data from the location in the memory array. The method further includes comparing the output data from the memory array in relation to the bypass data to determine whether the output data corresponds with the bypass data.

A number of feature refinements and additional features are applicable to the first aspect. These feature refinements and additional features may be used individually or in any combination. As such, each of the following features that will be discussed may be, but are not required to be, used with any other feature or combination of features of the first aspect.

For example, in an embodiment, the output data may not correspond to the bypass data. In this case, the method may also include asserting a protect mechanism. The protect mechanism may prevent the output data from being output as read data from the memory location. As such, the asserting may include blocking the output data from being output as read data from the memory location. However, rather than providing a selector for selecting between bypass data and output data, the method may include blocking the output by the protect mechanism in response to the comparing. This may assist in improving the speed of execution of the memory array as compared to a memory array where a selector is provided.

The blocking of the output data may be maintained by the protect mechanism based on a clock signal of the computing system in which the memory array is provided. As such, the protect mechanism may reset upon completion of the clock cycle. In this regard, the method of the first aspect may be repeated for each subsequent clock cycle. Furthermore, the use of a hold time tuning module may be eliminated.

Alternatively, the output data may correspond to the bypass data. In this case, the method may include outputting the output data that is read from the memory location using the memory I/O module as read data from the memory location. That is, the output data provided by the I/O module to the protect mechanism may be passed through as read data to another component in the computing environment.

In an embodiment, the memory array may be operable to receive a write command. A write path may be used by the memory I/O module when receiving the write command to write data to the memory location. The memory array may also operable to receive a read command such that a read path is used by the memory I/O module when receiving the read command to read data from the memory location. In an embodiment, the write path and the read path may be used in the bypass operation. That is, the method may include use of standard read and write paths of a memory I/O in the reading and writing operations, respectively. The bypass operation may include a write command and a read command. In an embodiment, the writing operation and the reading operation of the bypass operation may occur in a single clock cycle period of the memory array.

A second aspect described herein includes a memory array operable for process variation tolerant bypass operation. The memory array includes at least one location in the memory array capable of having data written to and read from the location. The memory array also includes a memory I/O module in operative communication with the location, wherein the memory I/O module is operable write data to and read data from the location. The memory I/O module is operable to receive a memory operation corresponding to a bypass operation including bypass data to be written to the location and output as read data from the location. The memory array may also include a protect module in operative communication with the memory I/O module. The protect module is operable to compare output data read from the memory location during the bypass operation in relation to the bypass data to detect a false read by the memory I/O module during the bypass operation. Accordingly, upon detection of the false read, the protect module is operable to prevent read out of false output data as read data from the location during the bypass operation.

A number of feature refinements and additional features are applicable to the second aspect. These feature refinements and additional features may be used individually or in any combination. As such, each of the following features that will be discussed may be, but are not required to be, used with any other feature or combination of features of the second aspect.

In an embodiment, the protect module may receive a bypass data verification signal indicative of the bypass data for use in comparing the output data to an expected value of the output based on the bypass data verification signal. In this regard, the bypass data verification signal may include the bypass data.

The memory I/O module may utilize a read path in the bypass operation. For example, the read path may be used during a read operation executed by the memory I/O module. That is, the read path utilized in a read operation and a bypass operation may be the same. It may be appreciated that utilization of the memory I/O read path may increase the speed of execution of the memory array versus an array that employs a selector to select bypass data or output data received from the memory I/O module.

In an embodiment, the memory array may be operable to receive a clock signal from a clock. The clock signal may define a clock cycle period. The bypass operation may occur in a single clock cycle period. That is, the writing of the bypass data to and reading of the bypass data from the memory location may occur in the same clock cycle period. The protect module may reset upon completion of a clock cycle period. As such, the memory array may accept a subsequent memory command in each successive clock cycle period.

In an embodiment, the false read may result from process variation in control signals of the memory I/O module. The process variation may at least in part due to differences in hardware used in the operation of the memory array.

A third aspect described herein includes a computing system. The computing system includes a processor operable to output memory commands for execution to write data to a memory location and to read data from a memory location. The computing system also includes a memory array comprising at least one location in the memory array capable of having data written to and read from the location. The computing system also includes a memory I/O module in operative communication with the processor. The memory I/O module is operable write data to and read data from the location. The memory I/O module is also operable to receive a memory operation corresponding to a bypass operation from the processor including bypass data to be written to the location and output as read data from the location. The computing system also includes a protect module in operative communication with the memory I/O module. The protect module is operable to compare output data read from the memory location during the bypass operation in relation to the bypass data to detect a false read by the memory I/O module during the bypass operation, and wherein upon detection of the false read, the protect module is operable to prevent output of false output data as read out data from the location during the bypass operation.

A number of feature refinements and additional features are applicable to the third aspect. These feature refinements and additional features may be used individually or in any combination. As such, each of the following features that will be discussed may be, but are not required to be, used with any other feature or combination of features of the third aspect.

For example, in an embodiment, the bypass operation may be executed in a single clock cycle period of the computing system.

The present invention is directed to the embodiments and aspects that are summarized above, alone or in any combination, as well as additional embodiments and aspects and combinations thereof that will be apparent from the following description of the invention. However, the foregoing summary is intended to provide a basic understanding of at least some embodiments and aspects of the invention. This summary is not an extensive overview of the invention and is not intended to identify key or critical elements of the invention or to delineate the scope of the invention. The foregoing summary merely presents some concepts of the invention in general form as a prelude to a more detailed description provided below.

DETAILED DESCRIPTION

The following description is not intended to limit the invention to the forms disclosed herein. Consequently, variations and modifications commensurate with the following teachings, skill and knowledge of the relevant art are within the scope of the present invention. The embodiments described herein are further intended to explain modes known of practicing the invention and to enable others skilled in the art to utilize the invention in such, or other embodiments and with various modifications required by the particular application (s) or use(s) of the present invention.

Figure 1A:
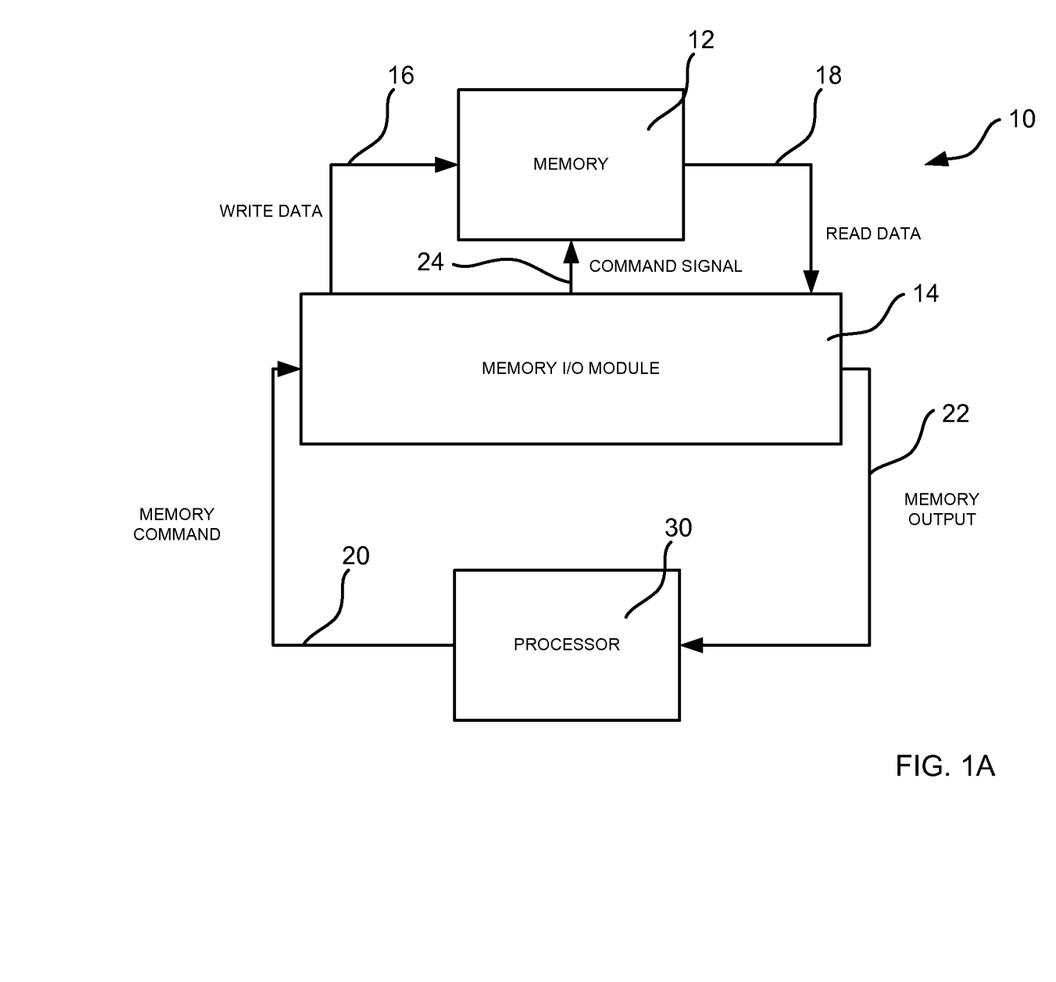
FIGS. 1A-1C depict schematic views of an embodiment of a computing system including a memory array with examples of write and read operations illustrated.

With reference to FIG. 1A, an example of a computing system 10 is depicted. As shown in FIG. 1A, the computing system 10 may include a processor 30 that may be in operative communication with a memory I/O module 14. In turn, communication between the memory I/O module 14 and a memory location 12 may be established such that write data 16 and/or read data 18 may be communicated between the memory location 12 and the memory I/O module 14. Furthermore, the memory I/O module 14 may communicate a command signal 24 to the memory location 12. The command signal 24 may be used to control read and/or write operations of the memory location 12 by the memory I/O module 14. In this regard, the memory location 12 and memory I/O module 14 may define a memory array that is operable to read data from memory location 12 and/or write data to memory location 12.

As such, the processor 30 may be operative to provide a memory command 20 to memory I/O module 14, which in turn may communicate the command signal 24 and/or write data 16 to the memory location 12 to take action with respect to the write data 16 (e.g., the command signal 24 may command the write data 16 to be written to the memory location 12) or with respect to the read data 18 (e.g., the command signal 24 may command the read data 18 to be read from the memory location 12). That is, the state of the command signal 24 in combination with the status of the write data 16 may be used to control the memory location 12 to store or retrieve data therefrom. In this regard, the memory I/O module 14 may also provide a memory output 22 to the processor 30 that may correspond with data read from the memory location 12. Accordingly, the memory I/O module 14 may be operable to write data into the memory location 12 and/or read data from the memory location 12. In normal read and write operations, the read and write operations occur separately (i.e., in different clock cycle periods).

Figure 1B:
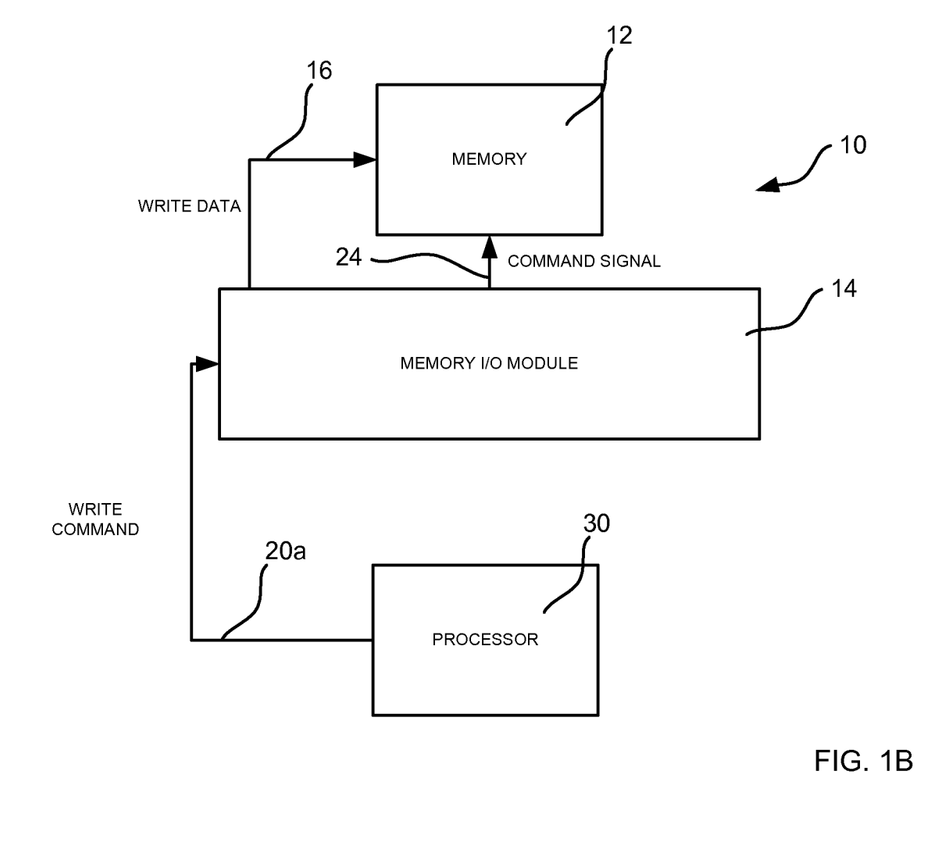

For example, with further reference to FIG. 1B the processor 30 may communicate a write command 20a to the memory I/O module 14. In this regard, the write command 20a may include write data 16 that may be provided to the memory location 12 by the memory I/O module 14. Furthermore, the memory I/O module 14 may provide a command signal 24 to the memory location 12 that results in the writing of the write data 16 to the memory location 12.

Figure 1C:
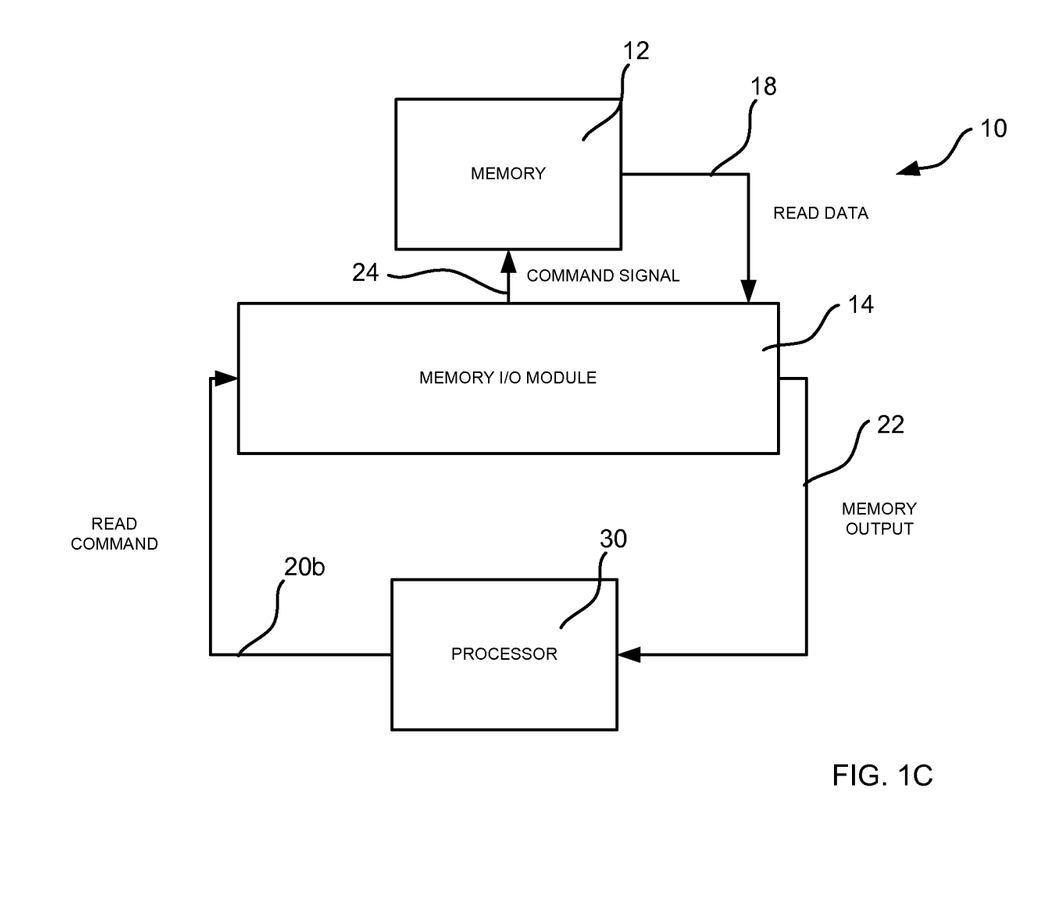

In another example depicted in FIG. 1C, the processor 30 may communicate a read command 20b to the memory I/O module 14. In turn, the memory I/O module 14 may provide a command signal 24 to the memory location 12 such that data stored in the memory location 12 is output as read data 18 to the memory I/O module 14. In turn, the memory I/O module 14 may provide a memory output 22 to the processor 30. As such, data that is stored in the memory module 12 may be read out as a memory output 22. While the memory output 22 is described herein as being provided to the processor 30, in other examples, the memory output 22 may be communicated to other components in the computing system (e.g., a different processor other than the processor 30 issuing the read command, a data bus, another appropriate component, or the like).

In addition to read and write operations as described above with respect to FIGS. 1B and 1C, respectively, a computing system may be operable to perform a bypass operation. In a bypass operation, data is written to and subsequently read from a memory location in a single clock cycle period. Accordingly, a bypass command 20c may be communicated from the processor 30 to the memory I/O module 14. The bypass command 20c may include a write command and a read command. In turn, in the same clock cycle (e.g., as defined by a system clock operable to generate a clock signal), the newly written data associated with the bypass command 20c may also to be read from the memory location 12 and provided as memory output 22.

In view of the fact both writing of data and reading of data must occur for bypass operation, difficulties have existed in providing the proper execution of the bypass operation such that false reads, false writes, corrupt data, or other issues are avoided. Furthermore, approaches to preventing issues associated with bypass operation at a memory location may introduce inefficiencies in the execution of a computing system.

As a result the speed at which a computing system may be executed may be reduced and the potential for errors may be present.

Figure 2:
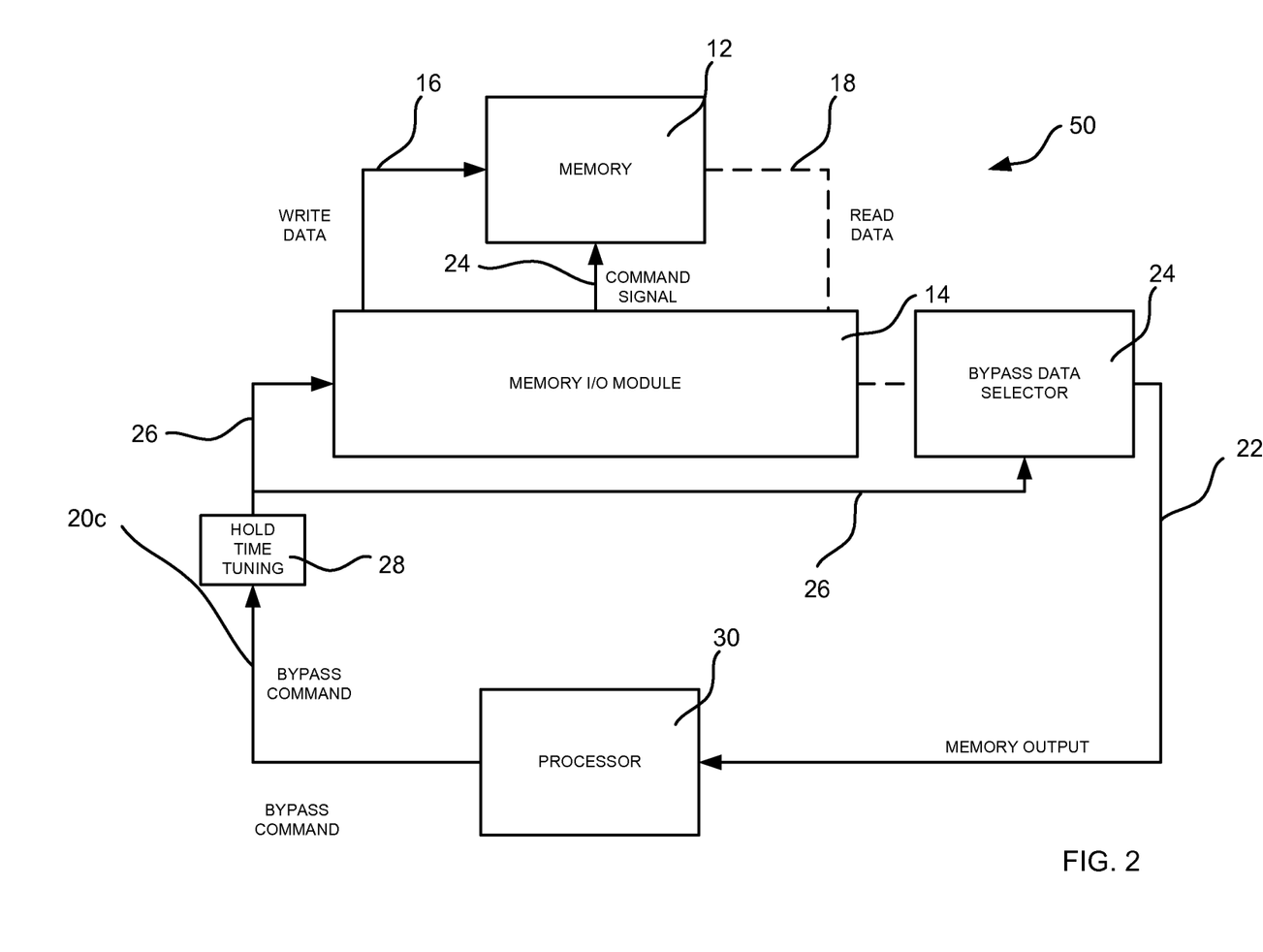
FIG. 2 depicts a schematic view of an embodiment of a computing system including a memory array for use in bypass operation including a bypass data selector module.

For example, one approach to execution of bypass operation in a memory array may involve executing the writing of bypass data to a memory location and providing alternative means of providing the bypass data as output from the memory array without utilization of normal read operations of a memory I/O module. That is, rather than employing standard write and read operation execution of a memory I/O module 14 as described above with respect to FIGS. 1B and 1C, bypass data may be written to the memory location 12 and the bypass data may also be separately provided to a selector (e.g., bypass data selector 24 shown in FIG. 2) that selectively establishes the data to be output. Such a scenario is depicted in the computing system 50 shown in FIG. 2. In FIG. 2, the processor 30 may communicate a bypass command 20c to the memory I/O module 14. The memory I/O module 14 may in turn provide a command signal 24 to the memory location 12 that results in the bypass data provided by the memory I/O module 14 as write data 16 being written to the memory location 12.

However, rather than employing the standard read operation and corresponding read path of the memory I/O module 14 to read the bypass data 26 from the memory location 12, the computing system 50 depicted in FIG. 2 may include a bypass data selection module 24 that is disposed between the memory I/O module 14 output and the processor 30 or other component to which the memory output 22 is provided. The bypass data selection module 24 may receive the bypass data 26 via a path other than the read path of the memory I/O module 14 employed during a read operation as described above in FIG. 1B. That is, the bypass data path may be provided that establishes a direct communication path to provide the bypass data 26 to the bypass data selector module 24.

In turn, the bypass data selector module 24 may be employed to multiplex the bypass data 26 for output as the memory output 22. Accordingly, the bypass data selector module 24 may be operable to select between read data 18 received from the memory I/O module 14 (e.g., as in the case of a normal read operation) and the bypass data 26 (e.g., as in the case of a bypass operation). In turn, the data newly written by the bypass operation to the memory location 12 may not in fact read from the memory location 12 as read data 18 as per standard read operations executed by the memory I/O module 14. Rather, the memory output 22 results from selection of the bypass data 26 by the bypass data selector 24 provided directly to the bypass data selector 24. The bypass data may be separately written to the memory location 12 via normal write operation of the memory I/O module 14.

However, the computing system 50 depicted in FIG. 2 suffers from a number of disadvantages that may limit the speed and/or accuracy of the computing system 50. In a first regard, the use of the bypass data selector module 24 to select between read data 18 and bypass data 26 may be slower to execute than the standard read operation not employing a bypass data selector module 24. For instance, the bypass data selector 24 may comprise a multiplexer capable of selecting between the read data 18 output by the memory I/O module 14 (e.g., to facilitate normal read operations associated with a read command) or the bypass data 26 directly received by the bypass data selector 24 (e.g., in the case of a bypass operation). However, the multiplexer used to select between the two signals for output may include a relative long stage that may add additional time to the execution of the computing system 50. This delay due to the long stage of the multiplexer employed by the bypass data selector 24 may be compounded when considering further multiplexers may be utilized in line with the memory output 22 for other actions taken with respect to the memory output 22 (e.g., the use of a repair multiplexer, etc.).

In another example, the bypass data selector 24 may include a plurality of transistors used to select an output from between at least two inputs to the bypass data selector 24. That is, a transistor may be loaded with data corresponding to read data 18 from the memory location 12 as provided by the memory I/O module 14. Another transistor may be loaded with data corresponding to the bypass data 26. Corresponding control signals may in turn be used to activate the appropriate transistor to provide the correct output as the memory output 22 (e.g., the read data 18 in the case of a read command 20a or the bypass data 26 in the case of a bypass command 20c). However, the relatively large loading of the transistors may also slow the speed at which the computing system 50 may be executed. Furthermore, as indicated above, should additional signals be required to be selectable for output as memory output 22 (e.g., repair signals, etc.), the required loading of additional transistors for any additional purposes may further compound the problem associated with slowing the operation of the computing system 50.

Another disadvantage of the computing system 50 shown in FIG. 2 is the required use of a hold time tuning module 28. The hold time tuning module 28 may be required to be provided for the bypass data 26 communicated directly to the bypass data selector 24 and to the memory I/O module 14 in order to maintain the data associated with the bypass operation for an appropriate duration. That is, for each clock cycle period of the computing system 50, the duration for which the bypass data 26 is provided may need to be controlled to prevent erroneous bypass data 26 being provided to the bypass data selector module 24 or memory I/O module 14 (e.g., to clear the bypass data 26 at the conclusion of the clock cycle period for which the bypass operation is active). Otherwise, carry over signals corresponding to previous or subsequent clock cycle periods may be erroneously provided to the memory I/O module 14 and the bypass memory selector 24 that may lead to false reads, false writes, corrupted data, or other errors. In this regard, the hold time tuning module 28 may introduce additional complexity and potential for false read operations with respect to the memory array. In this regard, the utilization of the bypass data selector 24 may both slow the execution of the computing system 50 as well as introduce the potential for errors absent proper hold time tuning of the bypass data.

Figure 3:
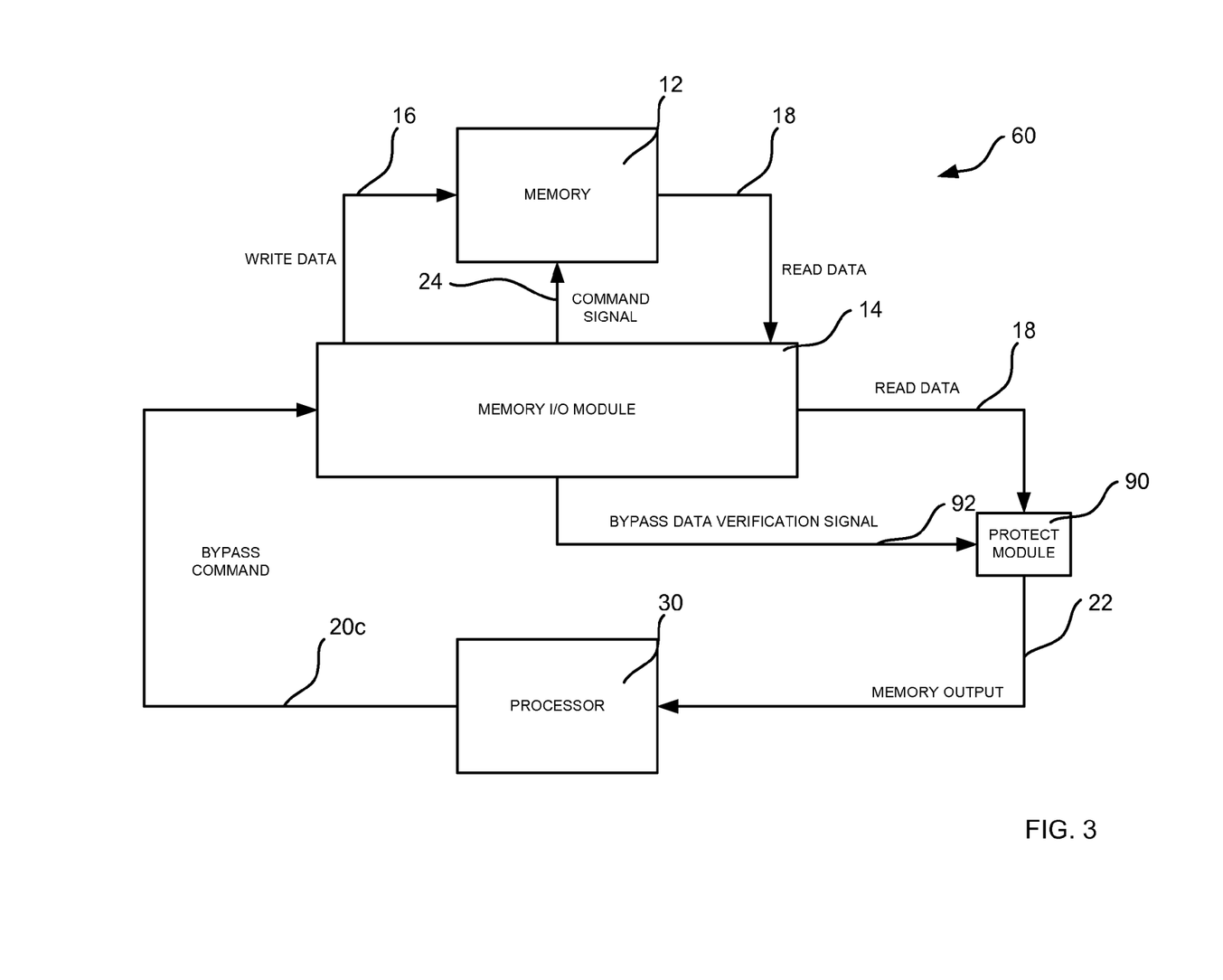
FIG. 3 depicts an embodiment of a computing system including a memory array with process variation tolerant bypass operation that may utilize normal read/write paths of a memory I/O module of the memory array.

Accordingly, with reference FIG. 3, a computing system 60 is depicted that may facilitate faster execution of a bypass operation than the computing system 50 depicted in FIG. 2. Generally, the computing system 60 depicted in FIG. 3 may facilitate faster execution of the memory array by eliminating the bypass data selector 24 interposed between the memory I/O module 14 and the memory output 22. Rather, the memory array in FIG. 3 may utilize a standard read operation data path of the memory I/O module 14 to generate the memory output 22 during a bypass operation. As such, given that the standard read operation data path of the memory I/O module 14 allows for a faster execution time than the use of a bypass data selector 24, the speed at which the bypass operation may be executed may be improved.

Turning to FIG. 3, as can be appreciated, the processor 30 may communicate a bypass command 20c to the memory I/O module 14. In turn, the memory I/O module 14 may provide write data 16 corresponding to bypass data included with the bypass command 20c to the memory location 12 to be written to the memory. As such, an appropriate command signal 24 may be communicated to the memory location 12 to control the writing of the write data 16 to the memory. Additionally, the command signal 24 may control the memory location 12 to provide read data 18 from the memory location 12. In turn, the read data 18 may be output from the memory I/O module 14. In this regard, it may be appreciated that the read data 18 is read from the memory location 12 by way of standard read operations. In this regard, the execution of the bypass command 20c may be carried out faster than in the computing system 10 depicted in FIG. 2 as the bypass data selector 24 may be eliminated.

However, despite the increase speed associated with the computing system 60 depicted in FIG. 3, the use of the standard read operation data path of the memory I/O module 14 may also introduce potential for false reads during the bypass operation. For example, the potential for a read error may be introduced because of process variations present in the various signals used in the bypass operation. The process variation may be associated with hardware used in the execution of the computing system 60. For example, process variations may result from physical variations in components used in the computing system 60. The physical variations and components may result from tolerances or manufacturing variances introduced in manufacturing of the hardware used in the computing system 60. In this regard, the signals used during the execution of the computing system 60 may be out of synchronization such that ideal operation of the memory array in FIG. 3 is not achieved. The lack of synchronicity of the signals may be due to the process variations that exist in the components. While stricter tolerances may be imposed during the manufacture of the hardware of the computing system 60, the cost of the components may become prohibitive given the tolerances necessary to achieve ideal operation. Furthermore, process variation in the signals may be attributed to differing numbers of gates used to generate or process the signal, signal skew, or other potential variations in the signals.

Figure 4:
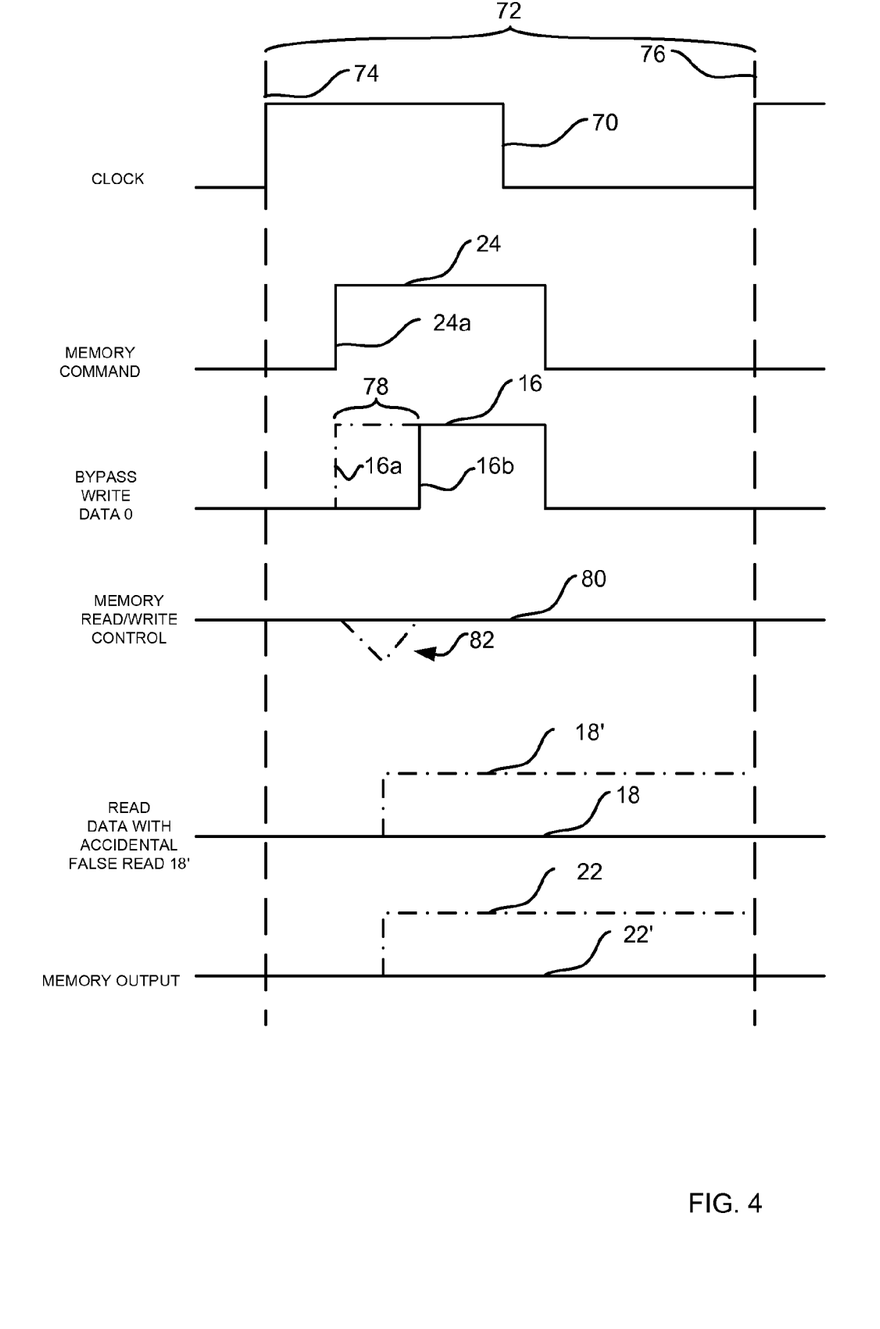
FIG. 4 depicts a number of signal waveforms corresponding to the embodiment of the computing system of FIG. 2.

With further reference to FIG. 4, a plurality of signal waveforms are depicted corresponding to instances of operation of the computing system 60 that illustrate the potential for a false read during a bypass operation executed by the computing system 60. In FIG. 4, a clock signal 70 is depicted. The clock signal 70 may originate from a clock (not shown) provided in the computing system 60. The clock signal 70 may define a clock cycle period 72 between consecutive rising edges of the clock signal 70, denoted in FIG. 4 as dotted lines 74 and 76.

A command signal 24 may be provided to the memory location 12 as described above. The command signal 24 may control the operation of the memory location 12 as described above. However, the result of the command signal 24 may depend upon the state of other signals provided to the memory 12 (e.g., the write data 16 at the time the command signal 24 is communicated to the memory location 12). As depicted in FIG. 4, an idealized write data 16 waveform (shown in phantom line) may initiate at a rising edge 16a that coincides with the rising edge 24a of the command signal 24. In this idealized scenario, the execution of the bypass operation may be correct and the write data 16 may be written to the memory location 12 and subsequently read from the memory location 12 such that no false read occurs.

However, as depicted in FIG. 4, the actual rising edge 16b of the write data 16 may be offset or out of synchronization with the command signal 24. The offset 78 between idealized rising edge 16a and actual rising edge 16b may be attributable to process variation (e.g., resulting from variations in hardware, signal skew, or other sources of variation). As such, because of the offset 78 between the command signal 24 and the write data 16, the control of the memory location 12 may result in a false read. That is, because of the period during the offset 78, the control of the memory location 12 may result in the value of the memory location 12 being read from the memory location 12 prior to the intended write operation associated with the bypass operation being completed. Therefore, a memory read/write control signal 80 utilized by the memory location 12 to execute read/write operations may undergo a deviation 82 that is attributable only to the offset 78 between the memory command 24 and the write data 16. This deviation 82 may be carried through the operation such that rather than idealized read data 18 corresponding to the idealized write data 16, corrupted read data 18' (e.g., corresponding to a value of the memory location 12 prior to the intended bypass write operation) may be output from the memory location 12 as a result of the deviation 82. As such, a corrupted memory output 22' may be output rather than an idealized memory output 22 corresponding to the write data 16 included in the bypass command 20c. In short, while utilization of the standard read operation path in bypass operation is faster than other approaches, due to the potential for process variation in the various signals controlling the operation of the memory location 12, the potential for a false read also increases.

In this regard, the computing system 60 may include a protect module 90. The protect module 90 may be operable to compare the value of the read data 18 received from the memory I/O module 14 in relation to the bypass data associated with the bypass command 20c to determine if a false read occurred. If a false read has occurred, the protect module 90 may provide a protect mechanism to block the passage of the false value of the read data 18 to the memory output 22. However, absent detection of a false read, the protect module 90 may allow the read data 18 to pass through to the memory output 22 for communication to the processor 30.

For example, in one embodiment, the protect module 90 may include a comparator that is operable to scrutinize the read data 18 received from the memory I/O module 14 in view of a bypass data verification signal 92. As shown, the bypass data verification signal 92 may be communicated to the protect module 90 from the memory I/O module 14. The bypass data verification signal 92 may include an indication of the expected value of the read data 18 in view of the bypass command 20c. However, rather than actually providing the bypass data to the protect module 90 for selection between the bypass data and the read data 18, the protect module 90 may simply allow the read data 18 to pass as memory output 22 or may block the read data 18, thus preventing the false read data 18' from being provided as a false memory output 22'. For example, the protect module 90 may include a transistor that may allow for selectively passing or blocking the read data 18 based on comparison of the read data 18 with the bypass verification signal 92.

The protect module 90 may also be operative to receive the clock signal 70 shown in FIG. 4. In this regard, the protect module 90 may be reset at the completion of each clock cycle period 72. That is, at the completion of the clock cycle period 72 in which the protect module 90 blocks the read data 18, the protect module 90 may reset such that the read data 18 is no longer blocked (e.g., to facilitate a read operation or subsequent bypass operation where the signal is scrutinized per the foregoing description). Accordingly, a hold time tuning module may not be required to ensure proper operation of the computing system 60.

Figure 5:
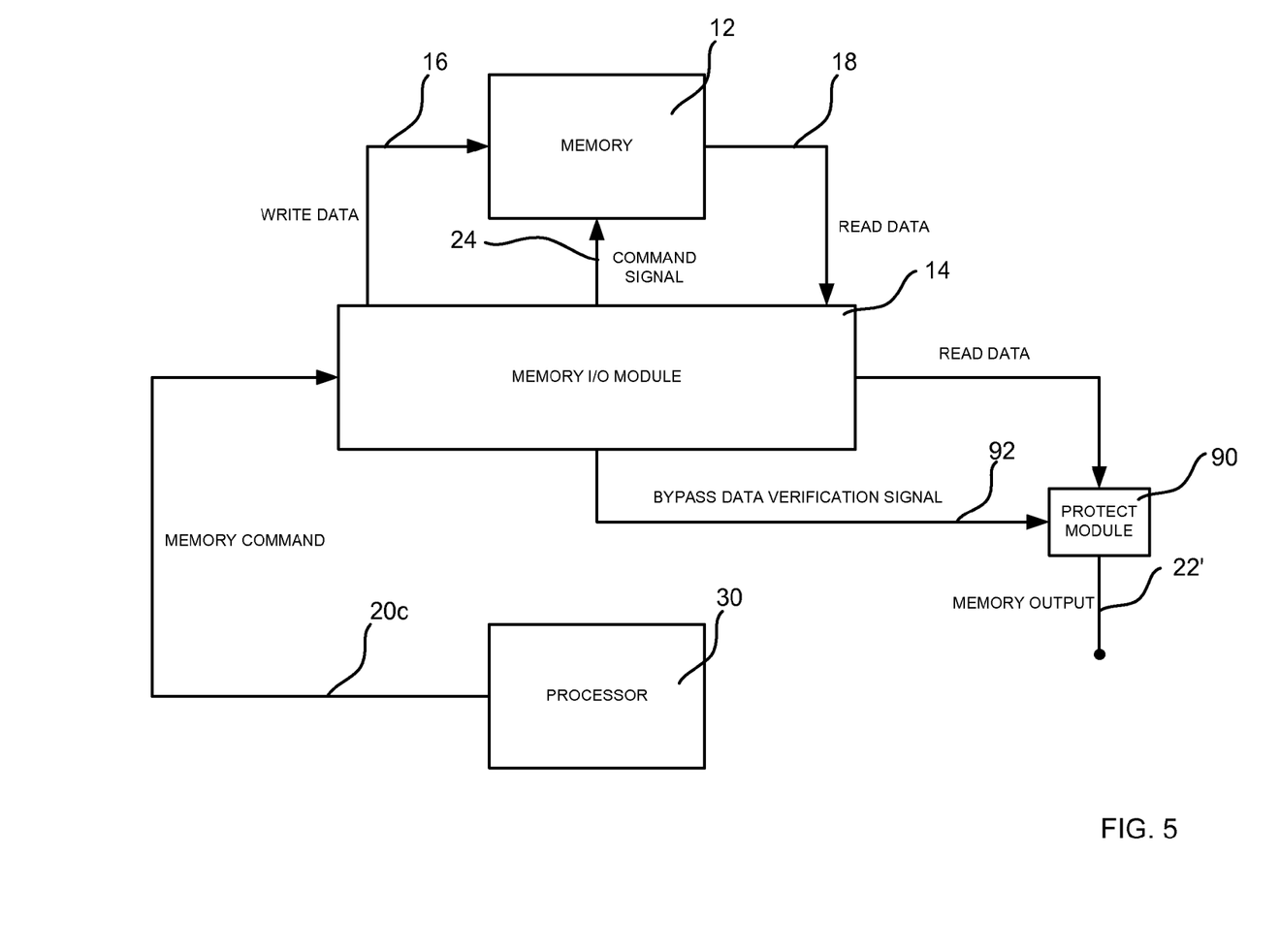
FIG. 5 depicts the embodiment of FIG. 3 with a protect signal asserted to prevent a false read.

In this regard, as shown in FIG. 5, if the corrupted read data 18' is provided to the protect module 90, the memory output 22' may be blocked from being output. In this regard, the false read memory output 22' resulting from the corrupted read data 18' may be blocked at the protect module 90 based on the comparison of the bypass data verification signal 92 and the corrupted read data 18'. As such, no memory output 22 may be provided.

As such, the computing system 60 may provide for increased speed of execution when performing a bypass operation. Furthermore, the potential for false reads introduced by the utilization of normal read operation data paths of the memory I/O module 14 may be reduced by way of a protect module 90. Thus, the computing system 60 may provide for faster, accurate execution of a bypass operation.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed is:

1. A method for process variation tolerant bypass operation of a memory array, comprising:
    receiving a memory command at the memory array corresponding to bypass operation of the memory array, wherein the memory command includes bypass data to be written to and read from a memory location of the memory array in a single clock cycle period of the memory array;
    writing, using a memory I/O module, the bypass data to a location in the memory array during the single clock cycle period;
    reading, using the memory I/O module, output data from the location in the memory array during the single clock cycle period;
    comparing the output data from the memory array during the single clock cycle period in relation to a bypass verification signal corresponding to an expected value of the output data of the single clock cycle period in view of the bypass data to determine whether the output data corresponds with the bypass data; and
    selectively passing the output data based on the comparing.

2. A method according to claim 1, wherein the output data does not correspond to the bypass data, and wherein the selectively passing comprises:
    asserting a protect mechanism, wherein the protect mechanism prevents the output data from being output as read data from the memory location.

3. A method according to claim 2, wherein the asserting comprises blocking the output data from being output as read data from the memory location.

4. The method according to claim 3, wherein the blocking is maintained by the protect mechanism based on a clock signal, and wherein the protect mechanism resets upon completion of a clock cycle.

5. A method according to claim 1, wherein the output data corresponds to the bypass data, and wherein the selectively passing comprises:
    outputting the output data read from the memory location using the memory I/O module as read data from the memory location.

6. A method according to claim 1, wherein the memory array is operable to receive a write command, wherein a write path is used by the memory I/O module when receiving the write command to write data to the memory location, and wherein the memory array is operable to receive a read command, wherein a read path is used by the memory I/O module when receiving the read command to read data from the memory location.

7. A method according to claim 6, wherein the write path and the read path are used in the bypass operation.

8. A method according to claim 7, wherein the bypass operation comprises a write command and a read command.

9. A memory array operable for process variation tolerant bypass operation, the memory array comprising:
at least one location in the memory array capable of having data written to and read from the location;
a memory I/O module in operative communication with the location, wherein the memory I/O module is operable write data to and read data from the location in a single clock cycle period of the memory array, wherein the memory I/O module is operable to receive a memory operation corresponding to a bypass operation including bypass data to be written to the location and output as read data from the location during the single clock cycle period; and
a protect module in operative communication with the memory I/O module, wherein the protect module is operable to compare output data read from the memory location during the bypass operation in the single clock cycle period in relation to the bypass data to detect a false read by the memory I/O module during the bypass operation, and wherein upon detection of the false read, the protect module is operable to prevent read out of false output data as read data from the location during the bypass operation, and wherein the protect module is operable to receive a clock signal indicative of the single clock cycle such that the protect module operates in coordinated relation to the received clock signal.

10. A memory array according to claim 9, wherein the protect module receives a bypass data verification signal indicative of the bypass data for use in comparing the output data to the bypass data.

11. A memory array according to claim 10, wherein the memory I/O module utilizes a read path in the bypass operation.

12. A memory array according to claim 11, wherein the read path is used during a read operation executed by the memory I/O module.

13. A memory array according to claim 9, wherein the memory array is operable to receive a clock signal from a clock, wherein the clock signal defines a clock cycle period.

14. A memory array according to claim 9, wherein the protect module resets upon completion of a clock cycle period.

15. A memory array according to claim 9, wherein the false read results from process variation in control signals of the memory I/O module.

16. A memory array according to claim 15, wherein the process variation is at least in part due to differences in hardware used in the operation of the memory array.

17. A computing system comprising:
a processor operable to output memory commands for execution to write data to a memory location and to read data from a memory location;
a memory array comprising at least one location in the memory array capable of having data written to and read from the location in a single clock cycle period of the memory array;
a memory I/O module in operative communication with the processor, wherein the memory I/O module is operable write data to and read data from the location during the single clock cycle period, wherein the memory I/O module is operable to receive a memory operation corresponding to a bypass operation from the processor including bypass data to be written to the location and output as read data from the location during the single clock cycle period, the bypass operation being executed in a single dock cycle period of the computing system; and
a protect module in operative communication with the memory I/O module, wherein the protect module is operable to compare output data read from the memory location during the bypass operation in relation to a bypass verification signal corresponding to an expected value of the output data in view of the bypass data to detect a false read by the memory I/O module during the bypass operation, and wherein upon detection of the false read, the protect module is operable to prevent output of false output data as read out data from the location during the bypass operation.

* * * * *